United States Patent [19]
Kagey

[11] Patent Number: 4,975,698
[45] Date of Patent: Dec. 4, 1990

[54] MODIFIED QUASI-GRAY DIGITAL ENCODING TECHNIQUE

[75] Inventor: Mark R. Kagey, La Jolla, Calif.

[73] Assignee: TRW Inc., Redondo Beach, Calif.

[21] Appl. No.: 448,039

[22] Filed: Dec. 8, 1989

[51] Int. Cl.$^5$ ............................................. H03M 7/16
[52] U.S. Cl. ........................................ 341/96; 341/97; 341/98
[58] Field of Search ..................... 341/96, 97, 98, 50, 341/159

[56] References Cited

U.S. PATENT DOCUMENTS

| | | | |
|---|---|---|---|
| Re. 26,780 | 2/1970 | Klinikowski | 340/347 |
| 2,831,184 | 4/1958 | Petherick | 340/347 |
| 3,383,655 | 5/1968 | McRae | 340/146.1 |
| 3,531,798 | 9/1970 | Bureau | 340/347 |
| 3,560,959 | 2/1971 | Bergey | 340/347 |
| 3,587,089 | 6/1971 | Elliott | 340/347 |
| 3,754,238 | 8/1973 | Oswald | 340/347 DD |
| 3,877,025 | 4/1975 | Maio | 340/347 AD |
| 3,913,094 | 10/1975 | Wootton, III | 341/97 X |
| 4,058,806 | 11/1977 | Nadler | 340/347 AD |
| 4,125,832 | 11/1978 | Shinoda et al. | 341/97 X |
| 4,386,339 | 5/1983 | Henry et al. | 340/347 AD |
| 4,591,825 | 5/1986 | Bucklen | 340/347 AD |
| 4,596,978 | 6/1986 | Fujita | 340/347 AD |
| 4,644,322 | 2/1987 | Fujita | 340/347 AD |

OTHER PUBLICATIONS

Akazawa, Yukio et al., "A 400MSPS 8b Flash AD Conversion LSI," 1987 IEEE International Solid-State Circuits Conference, Feb. 25, 1987, pp. 98-99.
Wakimoto, Tsutomu et al., "Si Bipolar 2GS/s 6b Flash A/D Conversion LSI," 1988 IEEE International Solid-State Circuits Conference, Feb. 19, 1988, pp. 232-233.

Primary Examiner—William M. Shoop, Jr.
Assistant Examiner—Sharon D. Logan
Attorney, Agent, or Firm—James M. Steinberger; Ronald L. Taylor

[57] ABSTRACT

A modified quasi-Gray encoding technique for use in parallel analog-to-digital converters that significantly reduces errors resulting from multiple simultaneous inputs. The encoding technique converts a one-in-$(2^n-1)$ digital code into an n-bit binary word that is the same as quasi-Gray code in all but its least significant bit position, which alternates in the same manner as standard binary code. For many multiple simultaneous inputs, the modified quasi-Gray code substantially reduces errors when compared with quasi-Gray code. For example, the modified quasi-Gray code reduces the maximum error from 3 to 2 for two simultaneous inputs separated by two bit positions ($n=8$). In a typical parallel analog-to-digital converter employing the modified quasi-Gray code, the one-in-$(2^n-1)$ digital code is converted into modified quasi-Gray code using a read-only memory. The modified quasi-Gray-encoded output of the read-only memory is then converted into standard binary code by a logic circuit requiring only a single gate delay.

8 Claims, 5 Drawing Sheets

ENCODING

DECODING

ENCODING

DECODING

ENCODING

DECODING

MODIFIED QUASI-GRAY DIGITAL ENCODING TECHNIQUE

BACKGROUND OF THE INVENTION

This invention relates generally to analog-to-digital (A/D) converters and, more particularly, to digital encoding techniques for reducing errors that normally arise during the analog-to-digital conversion process.

One of the most basic devices for converting analog signals into digital form is a parallel analog-to-digital converter. In a parallel A/D converter, an analog input signal is simultaneously compared to a large number of reference levels by a bank of comparators. For n bits of resolution in the digital output of the parallel A/D converter, there are $2^n - 1$ reference levels and comparators, with each reference level representing a digital increment or step in the digital output. For example, in an eight bit A/D converter, there are 255 reference levels and comparators.

The digital output of the bank of comparators is a series of logical "ones" and a series of logical "zeros," sometimes referred to as thermometer code. The comparators having reference level inputs that are less than or equal to the analog input signal generate outputs of one binary state, such as "ones," and the comparators having reference level inputs that are greater than the analog input signal generate outputs of the other binary state, in this case "zeros." The desired digital output of the A/D converter is the sum of these individual comparator outputs. The preferred approach for generating this sum is not to add the individual comparator outputs but to detect the single one-to-zero transition in the bank of comparators and convert that transition point into some type of binary code.

However, converting the one-to-zero transition point directly into standard binary code may result in large errors in the digital output when two or more transition points are generated by the bank of comparators. These multiple simultaneous transition points, which are usually within a few bit positions of each other, are caused by such factors as fluctuations in the analog input signal during the conversion process and non-matched comparator characteristics.

If two simultaneous transition points are converted into their respective binary codes, the output of the A/D converter will be the logical OR of the two binary codes. For example, suppose that the two simultaneous transition points are one bit position apart. If these two transition points are 0010 and 0011 in standard binary code, representing decimal values of 2 and 3, respectfully, the logical OR of these two codes is 0011. This result is either the correct value or one bit in error. However, if the two transition points are 0111 and 1000 in standard binary code, representing decimal values of 7 and 8, respectively, the logical OR of these two codes is 1111. This result, representing a decimal value of 15, is approximately double the correct value of 7 or 8.

There are several digital encoding techniques that substantially reduce the large errors resulting from the conversion of the one-to-zero transition point directly into standard binary code. These digital encoding techniques rely on the conversion of the one-to-zero transition point into some type of error-reducing intermediate binary code before the conversion into standard binary code. One of these error-reducing codes is the well known Gray code, a unit-distance code in which only one bit is allowed to change between adjacent digital codes.

In the example given above, the decimal values of 2 and 3 are encoded in Gray code as 0011 and 0010, respectively, and the decimal values of 7 and 8 are encoded as 0100 and 1100, respectively. The logical OR of each of these sets of Gray codes is either the correct value or just one bit in error. Because the logical OR of any two adjacent Gray codes is always equal to one of the two digital codes, the error is at most one part in $2^n$.

In a typical parallel A/D converter employing Gray code, the one-to-zero transition point is converted into Gray code using a read-only memory. The Gray-encoded output of the read-only memory is then converted into standard binary code by some type of logic circuit, usually a parallel-series arrangement of exclusive-OR gates. However, this type of logic circuit is very slow, requiring n gate delays to convert the Gray-encoded output into standard binary code. A digital encoding technique that has the error-reducing features of Gray code and can be converted into standard binary code in only a single gate delay is a modified Gray code known as quasi-Gray code.

In the example given above, the decimal values of 2 and 3 are encoded in quasi-Gray code as 0011 and 0010, respectively, and the decimal values of 7 and 8 are encoded as 0101 and 1111, respectively. The logical OR of each of these sets of quasi-Gray codes is either the correct value or just one bit in error, providing the same error-reducing performance as Gray code for two transition points separated by one bit position. However, the most commonly used technique for detecting the transition point is a bank of AND gates which cannot generate multiple transition points separated by only one bit position. Therefore, the performance of these digital encoding techniques must be examined for multiple transition points separated by two or more bit positions.

For example, suppose that two simultaneous transition points are two bit positions apart. If these two transition points are 0110 and 0101 in quasi-Gray code, representing decimal values of 5 and 7, respectively, the logical OR of these two codes is 0111, representing a decimal value of 4. This result is either one bit in error or a relatively large three bits in error. The logical OR of these same two decimal values in standard binary code is either the correct value or only two bits in error. Therefore, the error-reducing performance of quasi-Gray is actually worse than standard binary code in this example. Accordingly, there is a need for a digital encoding technique providing improved error performance for simultaneous transition points separated by two or more bit positions. The present invention clearly fulfills this need.

SUMMARY OF THE INVENTION

The present invention resides in a modified quasi-Gray encoding technique for use in parallel analog-to-digital converters that significantly reduces errors resulting from multiple simultaneous inputs. The encoding technique converts a one-in-$(2^n - 1)$ digital code into an n-bit binary word that is the same as quasi-Gray code in all but its least significant bit position, which alternates in the same manner as standard binary code. For many multiple simultaneous inputs, the modified quasi-Gray code substantially reduces errors when compared with quasi-Gray code. For example, the modified quasi-Gray code reduces the maximum error from 3 to 2 for two simultaneous inputs separated by two bit positions ($n=8$).

In a typical parallel analog-to-digital converter employing the modified quasi-Gray code, the one-in-($2^n-1$) digital code is converted into modified quasi-Gray code using a read-only memory. The modified quasi-Gray-encoded output of the read-only memory is then converted into standard binary code by a logic circuit requiring only a single gate delay.

It will be appreciated from the foregoing that the present invention represents a significant improvement over the use of quasi-Gray code in parallel analog-to-digital converters. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 6a is logic circuit for converting an n-bit binary word from standard binary code into the modified quasi-Gray code of the present invention and FIG. 4b is a logic circuit for converting a modified quasi-Gray-encoded binary word into standard binary code.

DETAILED DESCRIPTION OF THE PREFERRED EMBODIMENT

Figure 1:
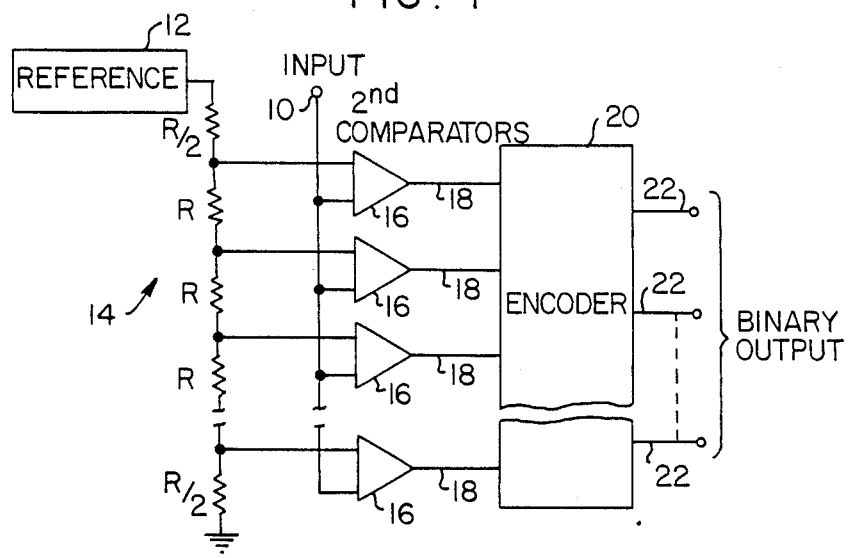
FIG. 1 is a simplified block diagram of a parallel analog-to-digital converter.

As shown in the drawings for purposes of illustration, the present invention resides in a digital encoding technique for use in parallel analog-to-digital (A/D) converters. As shown in FIG. 1, a parallel analog-to-digital converter includes an analog input signal, on line 10, and a plurality of reference levels derived from a common voltage reference 12. The voltage reference 12 is applied to a voltage divider 14 to provide the plurality of reference levels, with each reference level representing an increment or step in the digital output of the converter. For an n-bit converter, $2^n-1$ reference levels are generated by the voltage divider 14.

The $2^n-1$ reference levels are simultaneously compared with the analog input signal by a bank of comparators 16, resulting in a series of outputs of one binary state, such as logical "ones," and a series of outputs of the other binary state, in this case logical "zeros." The comparator outputs, on lines 18, are applied to an encoder 20, which generates a corresponding n-bit binary output, on lines 22. The encoder performs two steps to generate the binary output. The first step is to detect the transition from "ones" to "zeros" in the comparator outputs, generating a one-in-($2^n-1$) digital code. The second step is to convert this digital code into some type of binary code.

Various techniques are used to detect the one-to-zero transition point. One commonly used technique is to apply the comparator outputs to a bank of AND gates such that a logical "one" is generated at the transition point. This digital code is then converted into some type of binary code. However, converting the one-to-zero transition point directly into standard binary code may result in large errors in the digital output of the encoder 20 when multiple transition points are generated by the bank of comparators 16. These multiple transition points, which are usually within a few bit positions of each other, are caused by such factors as fluctuations in the analog input signal during the conversion process and non-matched comparator characteristics.

The use of Gray code as an intermediate code between the one-to-zero transition point and standard binary code reduces the maximum error of the output to only one part in $2^n$ for bit separations of one. The bit separation is the number of digital increments or steps between the correct one-to-zero transition point and the incorrect transition point. After the one-to-zero transition point is converted into Gray code, the Gray code is then immediately converted into standard binary code.

Figure 2A:
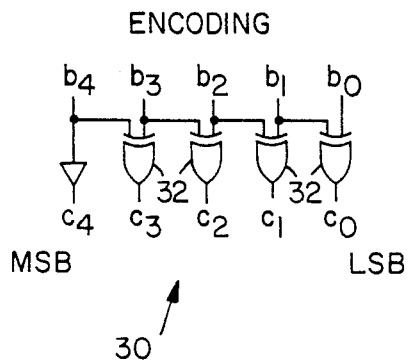
FIG. 2a is logic circuit for converting an n-bit binary word from standard binary code into Gray code and FIG. 2b is a logic circuit for converting a Gray-encoded binary word into standard binary code.

An algorithm for converting an n-bit word from standard binary code into Gray code is $$c_n = b_n \text{ and}$$

$$c_i = b_i \oplus b_{i+1}$$

where $b_i$ is the i-th bit and $b_n$ is the most significant bit (MSB) of the n-bit word in standard binary code and $c_i$ is the i-th bit and $c_n$ is the MSB of the n-bit word in Gray code. The index i varies from $n-1$ to 0 and $\oplus$ indicates an exclusive-OR. A logic circuit 30 of exclusive-OR gates 32 implementing this algorithm is shown in FIG. 2a.

Figure 2B:
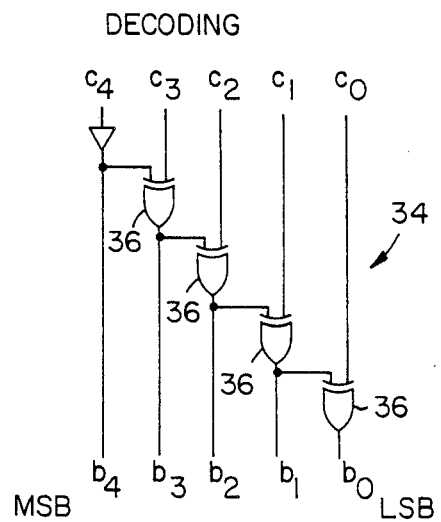

An algorithm for converting a Gray-encoded word into standard binary code is $$b_n = c_n$$

$$b_i = \bar{c}_i \text{ if } b_{i+1} = 1 \text{ and}$$

$$b_i = c_i \text{ if } b_{i+1} = 0$$

where $\bar{c}_i$ is the inverse of the i-th bit of the Gray-encoded word. A logic circuit 34 of exclusive-OR gates 36 implementing this algorithm is shown in FIG. 2b.

In a typical parallel A/D converter employing Gray code, the one-to-zero transition point is converted into Gray code using a read-only memory. The Gray-encoded output of the read-only memory is then converted into standard binary code by the logic circuit 34. However, this type of logic circuit is very slow, requiring n gate delays to convert the Gray-encoded output into standard binary code.

A digital encoding technique that has the error-reducing features of Gray code and requires only a single gate delay to be converted into standard binary code is a modified Gray code known as quasi-Gray code. An algorithm for converting an n-bit word from standard binary code into quasi-Gray code is $$c_n = b_n$$

$$c_i = \bar{b}_i \text{ if } c_{i+1} = 1 \text{ and}$$

$$c_i = b_i \text{ if } c_{i+1} = 0$$

Figure 3A:
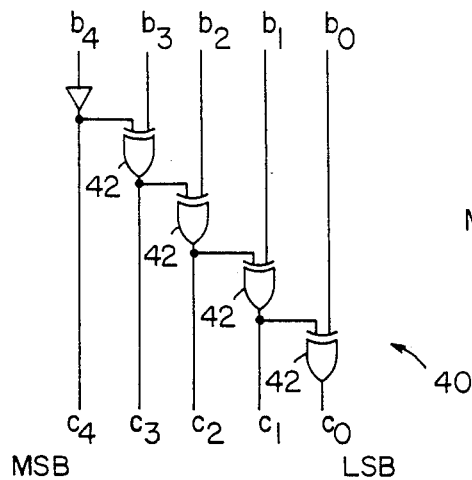
FIG. 3a is logic circuit for converting an n-bit binary word from standard binary code into quasi-Gray code and FIG. 3b is a logic circuit for converting a quasi-Gray-encoded binary word into standard binary code.

A logic circuit 40 of exclusive-OR gates 42 implementing this algorithm is shown in FIG. 3a.

An algorithm for converting a quasi-Gray-encoded word into standard binary code is $$b_n = c_n \text{ and}$$

$$b_i = c_i \oplus c_{i+1}$$

Figure 3B:
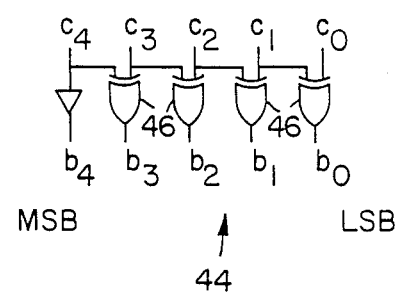

A logic circuit 44 of exclusive-OR gates 46 implementing this algorithm is shown in FIG. 3b.

The use of quasi-Gray code as an intermediate code between the one-to-zero transition point and standard binary code reduces the maximum error of the output to only one part in $2^n$ for bit separations of one, providing the same error-reducing performance as Gray code. However, the bank of AND gates commonly used to generate the one-to-zero transition point cannot generate multiple transition points separated by only one bit position. Therefore, the performance of these digital encoding techniques must be examined for multiple transition points separated by two or more bit positions.

Figure 5:
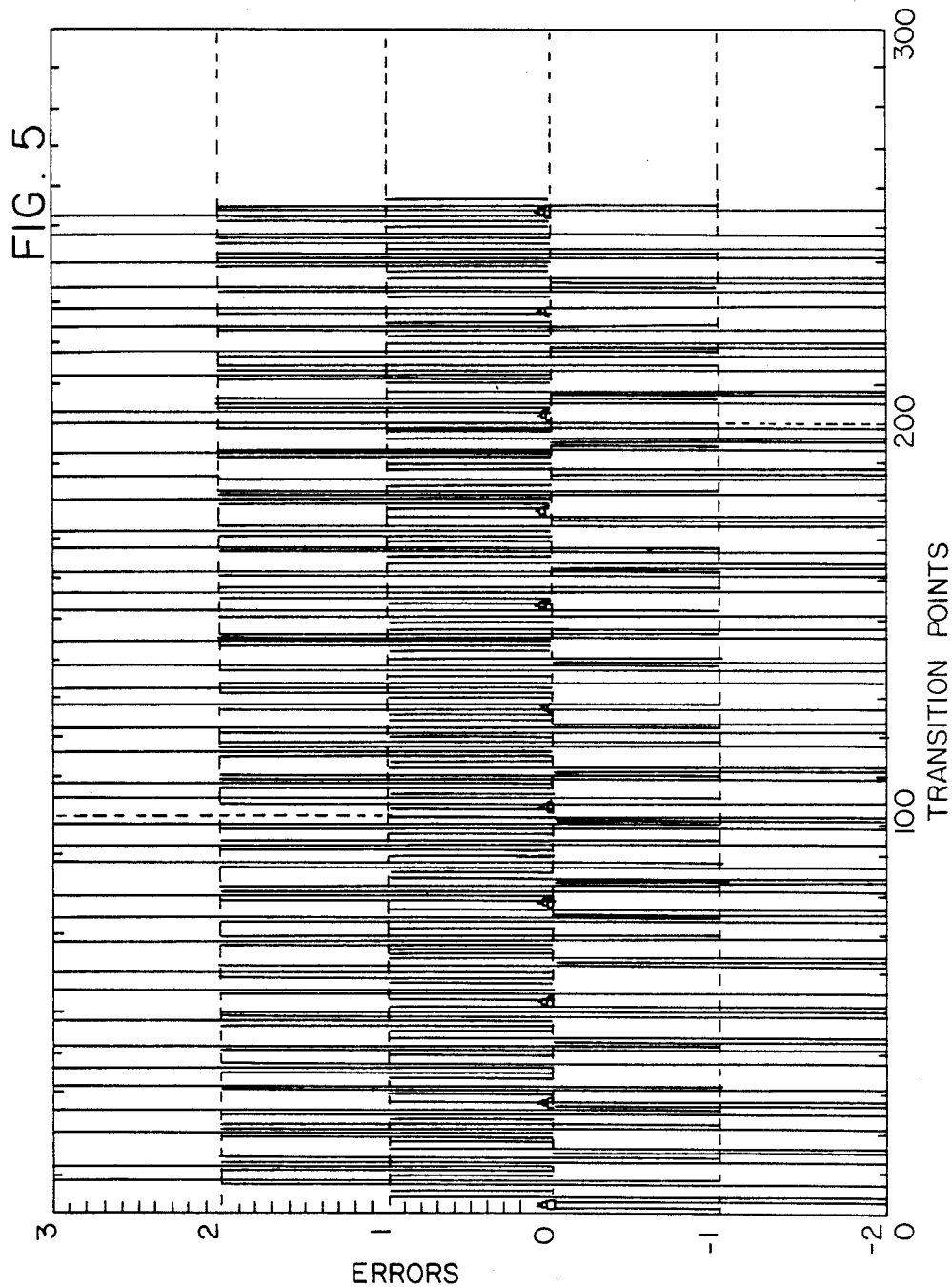
FIG. 5 is a graph of the errors that result when converting a one-in-($2^n-1$) digital code into an n-bit quasi-Gray code with two simultaneous transition points separated by two bit positions.

FIG. 5 illustrates a graph of the errors that result when a one-in-$(2^n-1)$ digital code (n=8) is converted into an n-bit standard binary code with two simultaneous transition points separated by two bit positions. The errors (Y-axis) range from zero to a very large $-128$ for the 255 $(2^8-1)$ possible transition points (X-axis). This should be compared with FIG. 6, which illustrates a graph of the errors that result when a one-in-$(2^n-1)$ digital code is converted into an n-bit quasi-Gray binary code, also with two simultaneous transition points separated by two bit positions. The errors range from $-2$ to a relatively large 3. Although the use of quasi-Gray code provides substantially reduced errors when compared to standard binary code, there is still room for improvement.

Figure 6A:
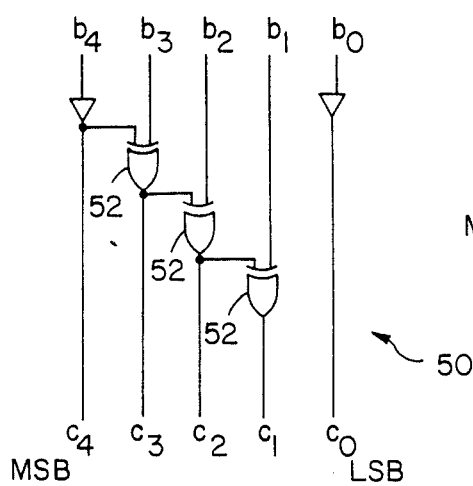

In accordance with the present invention, the conversion from a one-in-$(2^n-1)$ digital code to a binary code is provided by a modified quasi-Gray code having the characteristics of quasi-Gray code in all but the least significant bit position, which alternates in the same manner as standard binary code. An algorithm for converting an n-bit word from standard binary code into modified quasi-Gray code is $$c_n = b_n$$

$$c_i = \bar{b}_i \text{ if } c_{i+1} = 1$$

$$c_i = b_i \text{ if } c_{i+1} = 0 \text{ and}$$

$$c_0 = b_0$$

where $b_0$ is the least significant bit (LSB) of the n-bit word in standard binary code and $c_0$ is the LSB of the n-bit word in the modified quasi-Gray code. A logic circuit 50 of exclusive-OR gates 52 implementing this algorithm is shown in FIG. 6a.

An algorithm for converting a modified quasi-Gray-encoded word into standard binary code is $$b_n = c_n$$

$$b_i = c_i \oplus c_{i+1} \text{ and}$$

$$b_0 = c_0$$

Figure 6B:
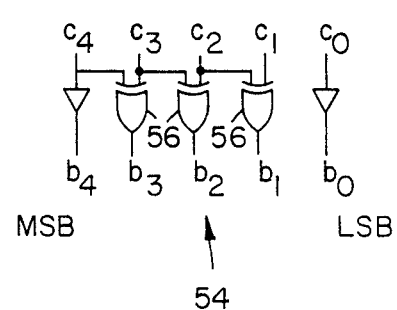
Figure 4:
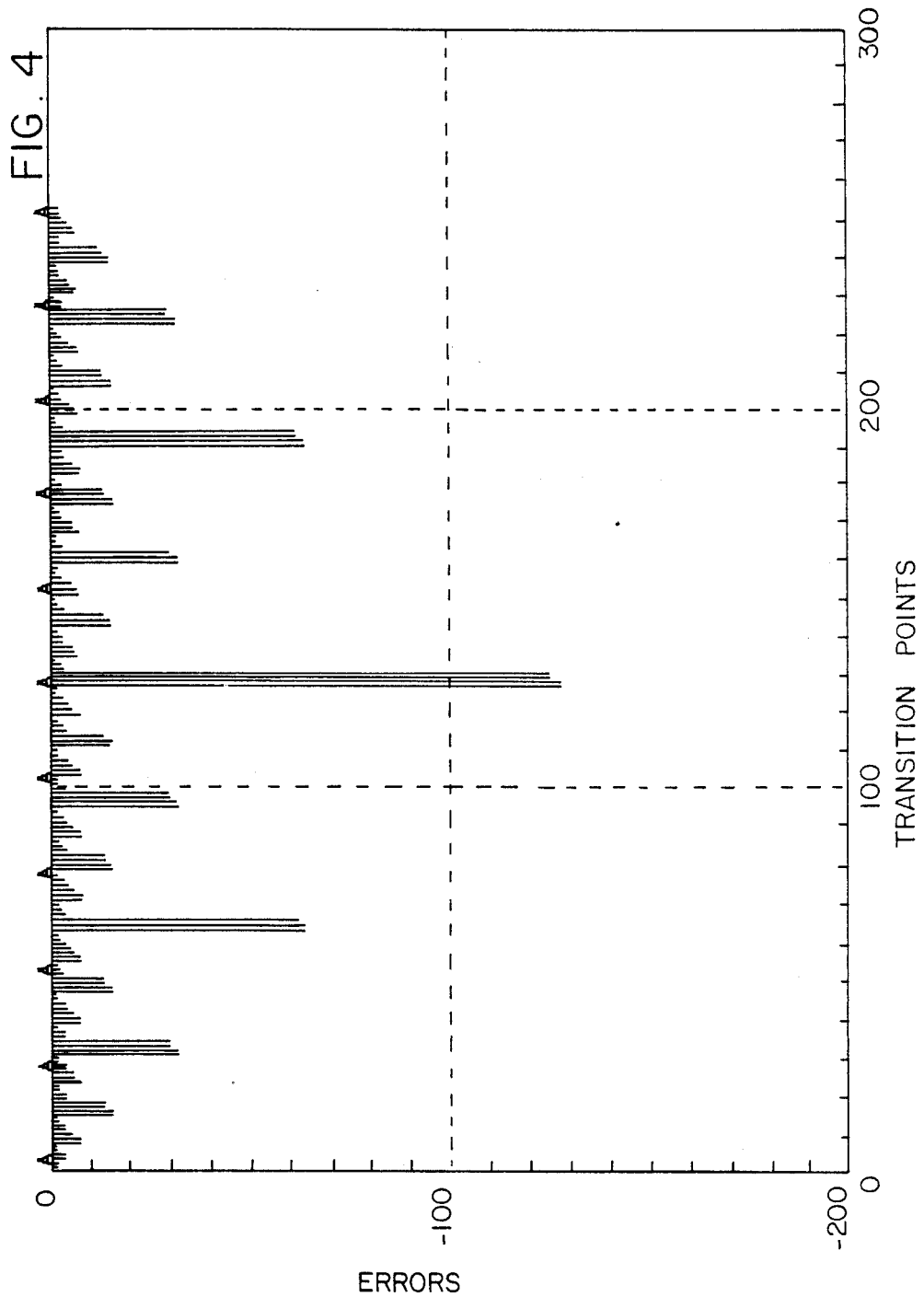
FIG. 4 is a graph of the errors that result when converting a one-in-($2^n-1$) digital code into an n-bit standard binary code with two simultaneous transition points separated by two bit positions.

A logic circuit 54 of exclusive-OR gates 56 implementing this algorithm is shown in FIG. 6b.

A comparison of standard binary code, Gray code, quasi-Gray code and modified quasi-Gray code, for decimal values from 0 through 15, is provided in Table 1. These binary codes are the numbers that are stored in the read-only memory as a function of the transition point for converting the one-in-$(2^n-1)$ code into the desired binary code in a parallel analog-to-digital converter.

Figure 7:
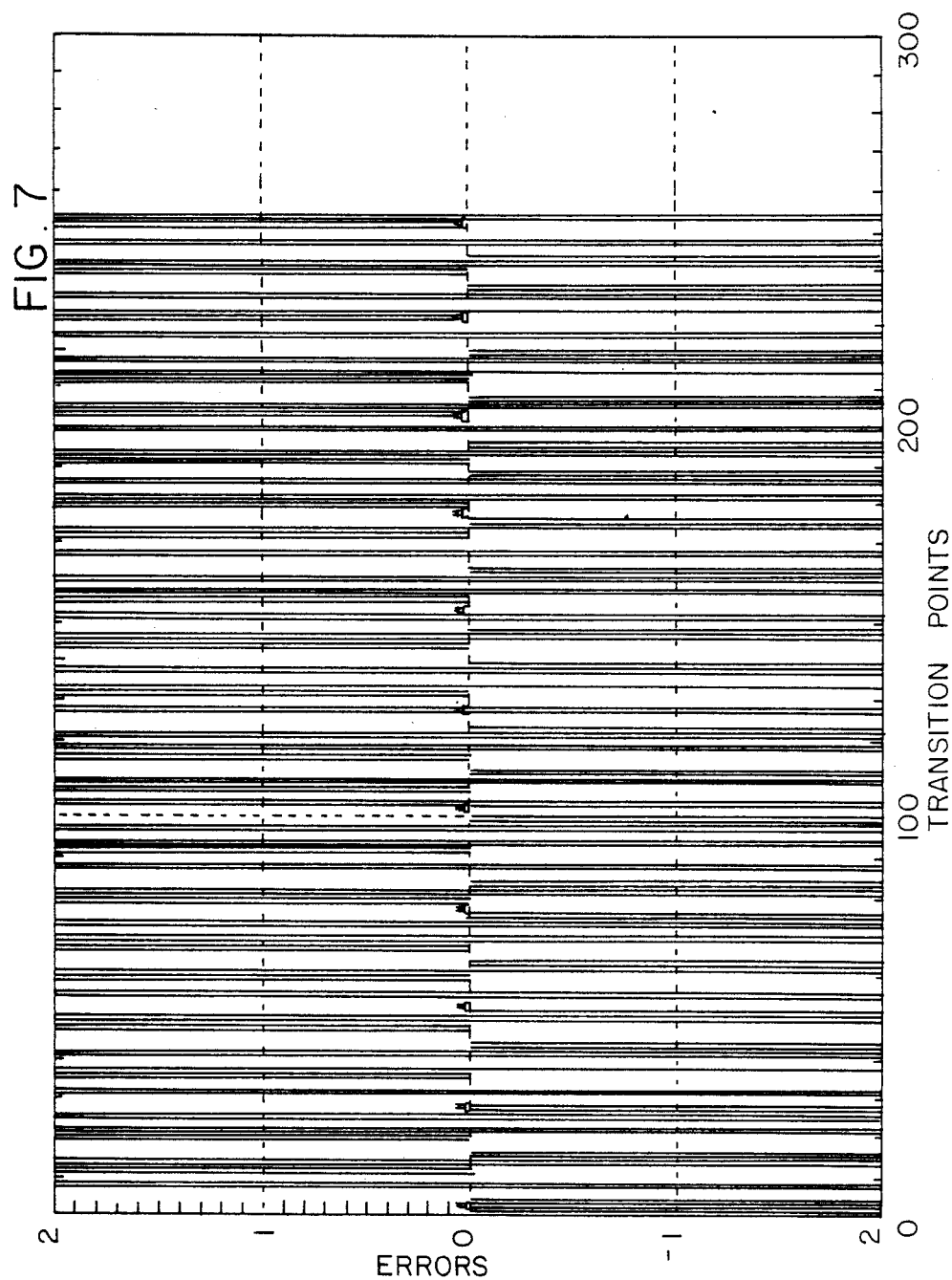
FIG. 7 is a graph of the errors that result when converting a one-in-($2^n-1$) digital code into an n-bit modified quasi-Gray code with two simultaneous transition points separated by two bit positions.

FIG. 7 illustrates a graph of the errors that result when converting a one-in-$(2^n-1)$ digital code (n=8) into an n-bit modified quasi-Gray code with two simultaneous transition points separated by two bit positions. The errors (Y-axis) range from 2 to $-2$, a considerable improvement over quasi-Gray code.

From the foregoing, it will be appreciated that the present invention represents a significant improvement over quasi-Gray code for digitally encoding the transition point in a parallel analog-to-digital converter. Although a preferred embodiment of the invention has been shown and described, it will be apparent that other adaptations and modifications can be made without departing from the spirit and scope of the invention. Accordingly, the invention is not to be limited, except as by the following claims.

TABLE 1

| Decimal | Binary | Gray | Quasi | M Quasi |
| --- | --- | --- | --- | --- |
| 0 | 0000 | 0000 | 0000 | 0000 |
| 1 | 0001 | 0001 | 0001 | 0001 |
| 2 | 0010 | 0011 | 0011 | 0010 |
| 3 | 0011 | 0010 | 0010 | 0011 |
| 4 | 0100 | 0110 | 0111 | 0110 |
| 5 | 0101 | 0111 | 0110 | 0111 |
| 6 | 0110 | 0101 | 0100 | 0100 |
| 7 | 0111 | 0100 | 0101 | 0101 |
| 8 | 1000 | 1100 | 1111 | 1110 |
| 9 | 1001 | 1101 | 1110 | 1111 |
| 10 | 1010 | 1111 | 1100 | 1100 |
| 11 | 1011 | 1110 | 1101 | 1101 |
| 12 | 1100 | 1010 | 1000 | 1000 |
| 13 | 1101 | 1011 | 1001 | 1001 |
| 14 | 1110 | 1001 | 1011 | 1010 |
| 15 | 1111 | 1000 | 1010 | 1011 |

I claim:
1. A digital encoder for use in an analog-to-digital converter, comprising:
transition detection means for detecting a transition point between binary states in an input signal, the transition detection means generating an output signal indicative of the transition point;
binary encoding means for receiving the output signal from the transition detection means, the binary encoding means converting the output signal into an n-bit binary word having the properties

$$c_n = b_n$$

$$c_i = \bar{b}_i \text{ if } c_{i+1} = 1$$

$c_i = b_i$ if $c_{i+1} = 0$ and $c_0 = b_0$ where $c_n$ is the most significant bit, $c_i$ is the i-th bit and $c_0$ is the least significant bit of the n-bit word and $b_i$ is the i-th bit, $\bar{b}_i$ is the inverse of the i-th bit, $b_n$ is the most significant bit and $b_0$ is the least significant bit of the n-bit word in standard binary code, the index i varying from $n-1$ to 1;

whereby errors arising from multiple transition points in the input signal are significantly reduced.

2. The digital encoder as set forth in claim 1, and further including:

binary decoding means for receiving the n-bit binary word from the binary encoding means, the binary decoding means converting the n-bit binary word into standard binary code;
wherein $b_n = c_n$ $b_i = c_i \oplus c_{i+1}$ and $b_0 = c_0$.

3. A digital encoder for use in an analog-to-digital converter, comprising:

transition detection means for detecting a transition point between binary states in an input signal, the transition detection means generating an output signal indicative of the transition point;

binary encoding means for receiving the output signal from the transition detection means, the binary encoding means converting the output signal into an n-bit binary word having the properties of quasi-Gray code in all but its least significant bit position, the least significant bit position alternating in the same manner as standard binary code;

whereby errors arising from multiple transition points in the input signal are significantly reduced.

4. The digital encoder as set forth in claim 3, and further including:

binary decoding means for receiving the n-bit binary word from the binary encoding means, the binary decoding means converting the n-bit binary word into standard binary code.

5. A digital encoding method for use in an analog-to-digital converter, comprising the steps of:

detecting a transition point between binary states in an input signal;

generating an output signal indicative of the transition point;

converting the output signal into an n-bit binary word having the properties $c_n = b_n$ $c_i = \bar{b}_i$ if $c_{i+1} = 1$ $c_i = b_i$ if $c_{i+1} = 0$ and $c_0 = b_0$ where $c_n$ is the most significant bit, $c_i$ is the i-th bit and $c_0$ is the least significant bit of the n-bit word and $b_i$ is the i-th bit, $\bar{b}_i$ is the inverse of the i-th bit, $b_n$ is the most significant bit and $b_0$ is the least significant bit of the n-bit word in standard binary code, the index i varying from $n-1$ to 1;

whereby errors arising from multiple transition points in the input signal are significantly reduced.

6. The digital encoding method as set forth in claim 5, and further including the step of:

converting the n-bit binary word into standard binary code;
wherein $b_n = c_n$ $b_i = c_i \oplus c_{i+1}$ and $b_0 = c_0$.

7. A digital encoding method for use in an analog-to-digital converter, comprising the steps of:

detecting a transition point between binary states in an input signal;

generating an output signal indicative of the transition point;

converting the output signal into an n-bit binary word having the properties of quasi-Gray code in all but its least significant bit position, the least significant bit position alternating in the same manner as standard binary code;

whereby errors arising from multiple transition points in the input signal are significantly reduced.

8. The digital encoding method as set forth in claim 7, and further including the step of:

converting the n-bit binary word into standard binary code.

* * * * *